United States Patent
Shiikuma (10) Patent No.: US 7,262,656 B2
(45) Date of Patent: Aug. 28, 2007

(54) CIRCUIT FOR PARALLEL OPERATION OF DOHERTY AMPLIFIERS

(75) Inventor: Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 104 days.

(21) Appl. No.: 11/205,178

(22) Filed: Aug. 17, 2005

(65) Prior Publication Data

US 2006/0044060 A1    Mar. 2, 2006

(30) Foreign Application Priority Data

Aug. 26, 2004   (JP) ............................ 2004-246593

(51) Int. Cl.
H03F 3/68    (2006.01)
H03F 3/52    (2006.01)
H03F 1/07    (2006.01)

(52) U.S. Cl. .................. 330/124 R; 330/286; 330/295
(58) Field of Classification Search ..................... None
See application file for complete search history.

(56) References Cited

U.S. PATENT DOCUMENTS

| | | | |
|---|---|---|---|
| 5,121,090 A | 6/1992 | Garuts et al. | |
| 5,285,175 A | 2/1994 | Edwards | |
| 5,363,072 A | 11/1994 | Sakamoto et al. | |
| 6,037,840 A * | 3/2000 | Myer | 330/295 |
| 6,320,462 B1 * | 11/2001 | Alley | 330/124 R |
| 6,384,680 B1 * | 5/2002 | Takei et al. | 330/124 R |
| 6,469,581 B1 * | 10/2002 | Kobayashi | 330/295 |
| 6,617,929 B2 * | 9/2003 | Kim et al. | 330/295 |
| 6,700,444 B2 * | 3/2004 | Pengelly | 330/295 |
| 6,737,914 B2 * | 5/2004 | Gu | 330/2 |
| 6,737,922 B2 * | 5/2004 | Pengelly et al. | 330/295 |

(Continued)

FOREIGN PATENT DOCUMENTS

JP       05-121916       5/1993

(Continued)

OTHER PUBLICATIONS

K. Cho, "RF High Power Doherty Amplifier for Improving the Efficiency of a Feedforward Linear Amplifier," 2004 IEEE MTT-S Digest, pp. 847-850.

(Continued)

*Primary Examiner*—Robert Pascal
*Assistant Examiner*—Krista Flanagan
(74) *Attorney, Agent, or Firm*—Foley & Lardner LLP (57) ABSTRACT

A circuit is disclosed for operating Doherty amplifiers in parallel in a small size circuit and at a low cost while reducing transmission loss and preventing a narrowed band. The circuit has a plurality of Doherty amplifiers and a signal combiner. Each of the plurality of Doherty amplifiers is applied with a distributed input signal which is amplified and delivered by the Doherty amplifier. The signal combiner is made up of a transmission line transformer, is connected to the outputs of the Doherty amplifiers and to its output terminal. The signal combiner has an impedance as viewed from the Doherty amplifiers, which represents an optimal load for the Doherty amplifiers, and an impedance as viewed from the output terminal, which is equal to the characteristic impedance of a transmission line connected to the output terminal. The signal combiner combines the outputs of the Doherty amplifiers and delivers the resulting output from the output terminal.

8 Claims, 5 Drawing Sheets

U.S. PATENT DOCUMENTS

| | | | |
|---|---|---|---|
| 6,750,707 B2 * | 6/2004 | Takei et al. | 330/124 R |
| 6,791,417 B2 * | 9/2004 | Pengelly et al. | 330/295 |
| 6,853,245 B2 | 2/2005 | Kim et al. | |
| 7,053,706 B2 * | 5/2006 | Kwon et al. | 330/124 R |
| 7,061,314 B2 * | 6/2006 | Kwon et al. | 330/124 R |
| 7,078,976 B2 * | 7/2006 | Blednov | 330/286 |
| 7,109,790 B2 * | 9/2006 | Kwon et al. | 330/124 R |
| 7,164,316 B2 * | 1/2007 | Kim et al. | 330/151 |
| 7,196,578 B2 * | 3/2007 | Kermalli | 330/124 R |

FOREIGN PATENT DOCUMENTS

| | | |
|---|---|---|
| JP | 2004-096729 | 3/2004 |

OTHER PUBLICATIONS

S.C. Cripps et al., "Doherty and Chireix, Advanced Techniques in RF Power Amplifier Design," Artech House 2002, pp. 33-56.

W.H. Doherty, "A New High Efficiency Power Amplifier for Modulated Waves," Proceedings of the Institute of Radio Engineers, vol. 24:9, Sep. 1936, pp. 1163-1182.

G. Gonzalez, "Microwave Transistor Amplifiers," Analysis and Design second edition, 1997, pp. 327-333.

R. McMorrow, "The Microwave Doherty Amplifier," 1994 IEEE MTT-S Digest (TH3E-7), pp. 1653-1656.

* cited by examiner

CIRCUIT FOR PARALLEL OPERATION OF DOHERTY AMPLIFIERS

BACKGROUND OF THE INVENTION

1. Field of the Invention

The present invention relates to a Doherty amplifier which combines outputs of a carrier amplifier and a peak amplifier that are different in operation class from each other, to deliver the combined output.

2. Description of the Related Art

Power amplifiers utilized in radio communications systems are required to provide linearity and high efficiency.

Also, in recent communications systems which employ multi-value digital modulation, often handle signals having a signal amplitude whose average value is different from a maximum value of the same. For amplifying such a signal, in a conventional amplifier, an operating point of the amplifier must be set such that the signal can be amplified without distortions up to a maximum amplitude. For this reason, the amplifier fails to operate near a saturated output, which would allow the amplifier to maintain a relatively high efficiency. This situation (i.e. amplifier barely operates near a saturated output) forces the amplifier to be used at a low efficiency.

To solve this problem, a variety of techniques have been proposed for improving the efficiency of an amplifier while maintaining the linearity. One of such techniques is a Doherty amplifier. The Doherty amplifier, which is aimed at improving the efficiency of a high output power amplifier, delivers a combination of outputs of a carrier amplifier and a peak amplifier which are different in operation class from each other. The basic operation and configuration of the Doherty amplifier was published in an article entitled "A New High Efficiency Power Amplifier for Modulated Waves" by W. H. Doherty, 1936 Proc. of IRE, Vol. 24, No. 9, pp 1163-1182, and thus is well known in the art.

The Doherty amplifier operates with the carrier amplifier maintaining saturation near saturated output power, a higher efficiency can be provided than in normal class-A and class-AB amplifiers as a whole even if the Doherty amplifier delivers an output with a backoff taken from the saturated power. The backoff refers to the difference between average output power and the saturated power. A large backoff state thus refers to a state in which the average output power is smaller than the saturated power.

The general operating principles of the Doherty amplifier are well known, for example, from an article entitled "Advanced Technique in RF Power Amplifiers" by Steve C. Cripps, Artech House 2002, pp 33-56, relevant to the present invention will be described below.

A combiner circuit for combining the output of the carrier amplifier with the output of the peak amplifier is made up a transformer or an impedance converter, and often includes a transmission line of one-quarter wavelength when it handles a signal in a micro-wave band. For an ideal operation of the Doherty amplifier, the impedance of a load, as viewed from an output combination point, is typically set to $Z_0/2$, where $Z_0$ represents the characteristic impedance of a transmission line. Typically, $Z_0$ is set to 50 Ω in high frequency circuits.

As a circuit for covering the load impedance $Z_0/2$ to the characteristic impedance $Z_0$ in order to accomplish impedance matching, in a high frequency band, a transmission line of one-quarter wavelength is used between the combination point and output. As an example of such a circuit, a combiner circuit implemented in the micro-wave band was published in an article THE MICROWAVE DOHERTY AMPLIFIER" by R. J. McMorrow et al., 1994 IEEE MTT-S Digest (TH3E-7), pp 1653-1656).

Amplifiers have also been increasingly required to produce higher power, and this requirement has conventionally been met by operating a plurality of amplifiers in parallel to produce higher power. Well-known methods for operating a plurality of amplifiers in parallel include an in-phase distribution combination type using a Wilkinson distribution combiner, a push-pull type, a balance type using a hybrid circuit, and the like. For example, an article "MICROWAVE TRANSISTOR AMPLIFIERS Analysis and Design second edition" by Guillermo Gonzalez, pp 327-333, Prentice-Hall, 1997, a general method of operating a plurality of amplifiers in parallel employs the balance type using a hybrid circuit, a Wilkinson distribution combiner, and the like.

From the foregoing, it is thought that Doherty amplifiers, having a high efficiency, are effectively operated in parallel for producing a higher output in order to satisfy the requirements for linearity and high efficiency and to accomplish a higher output.

As described above, in general the ideal impedance of a load, viewed from a Doherty amplifier, is different from characteristic impedance $Z_0$ of a system, and is one half the characteristic impedance, i.e., $Z_0/2$. Therefore, for operating a plurality of Doherty amplifiers in parallel in a push-pull configuration or in a balanced configuration, a circuit is required at the output to convert impedance $Z_0$ of a combiner for combining outputs of the plurality of Doherty amplifiers, to load impedance $Z_0/2$ of the Doherty amplifiers.

Figure 1:
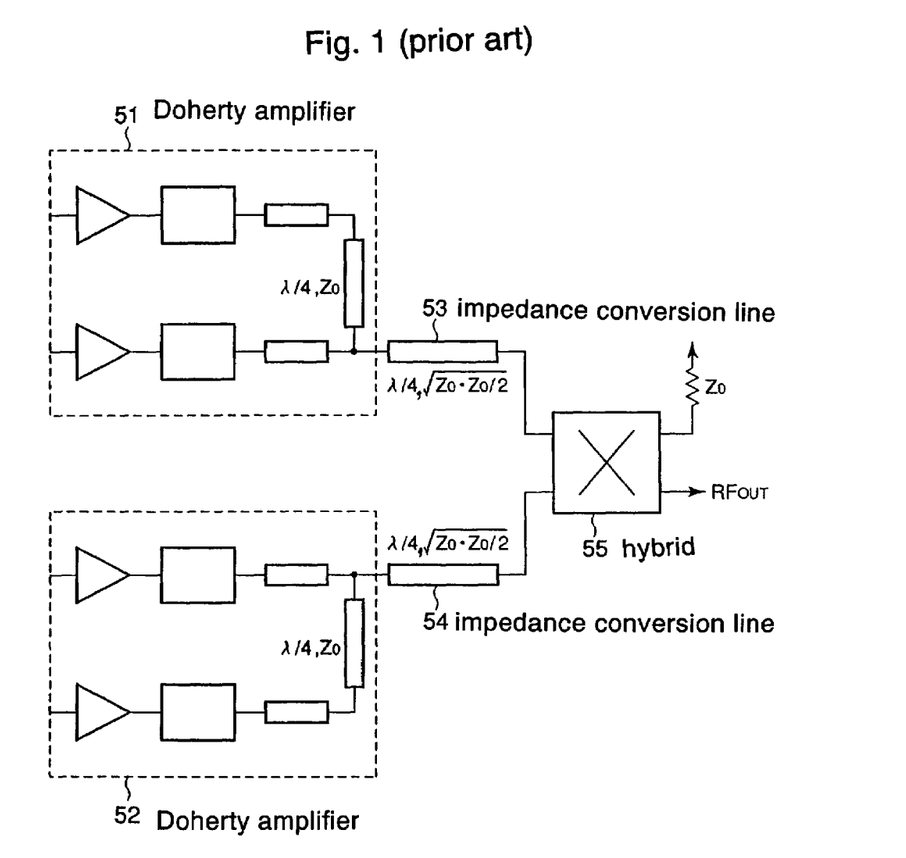
FIG. 1 is a diagram illustrating a conventional circuit for operating Doherty amplifiers in parallel.

As an example of the parallel operation of Doherty amplifiers, "RF HIGH POWER DOHERTY AMPLIFIER FOR IMPROVING THE EFFICIENCY OF A FEEDFORWARD LINEAR AMPLIFIER" by Kyoung-Joon Cho et al, 2004 IEEE MTT-S digest (WE6C-3), pp 847-850 has proposed a balanced-type amplifier which couples two Doherty amplifiers using a hybrid circuit for parallel operation. FIG. 1 is a circuit diagram illustrating a conventional circuit for operating Doherty amplifiers in parallel. Referring to FIG. 1, at the output of each of Doherty amplifiers 51, 52, there is connected quarter-wavelength impedance conversion line 53, 54 for converting the impedance from $Z_0/2$ to $Z_0$. Hybrid 55 is connected at the outputs of quarter-wavelength impedance conversion lines 53, 54 that for combines the outputs of two Doherty amplifier 51, 52. These components make up a balanced amplifier based on the Doherty amplifiers that operate in parallel.

However, the foregoing prior art example suffers from the following problems.

The conventional combiner circuit illustrated in FIG. 1, presents a problem of larger signal transmission loss and lower amplifier efficiency due to the extended transmission line from each Doherty amplifier to the output.

Further, since the impedance conversion lines and power combiner such as the hybrid circuit are both constructed by one-quarter wavelength transmission lines, the band is limited so that a desired operation can only be performed in a limited narrow band.

Furthermore, a terminator is required in the combiner both in a configuration using a hybrid combiner and in a configuration using a Wilkinson combiner. Thus, such a configuration is disadvantageous in point of a reduction in size and cost because the line portion including the impedance conversion line is large.

SUMMARY OF THE INVENTION

It is an object of the present invention to provide a compact and low-cost circuit for operating Doherty amplifiers in parallel, which reduces transmission loss, prevent a band from being narrowed.

To achieve the above object, a Doherty amplifier parallel operation circuit according to the present invention that amplifies an input signal to deliver the amplified signal at an output terminal, includes a plurality of Doherty amplifiers and a signal combiner.

Doherty amplifiers each receives and amplifies a distributed input signal for output. The signal combiner is made up of a transmission line transformer, is connected to the outputs of the Doherty amplifiers and to the output terminal. The signal combiner has an impedance as viewed from the Doherty amplifiers, which represents an optimal load for the Doherty amplifiers, and an impedance as viewed from the output terminal, which matches the characteristic impedance of a transmission line connected to the output terminal. The signal combiner combines the outputs of the Doherty amplifiers and delivers the resulting output from the output terminal.

The above and other objects, features and advantages of the present invention will become apparent from the following description with reference to the accompanying drawings which illustrate examples of the present invention.

DETAILED DESCRIPTION OF THE EMBODIMENTS

Figure 2:
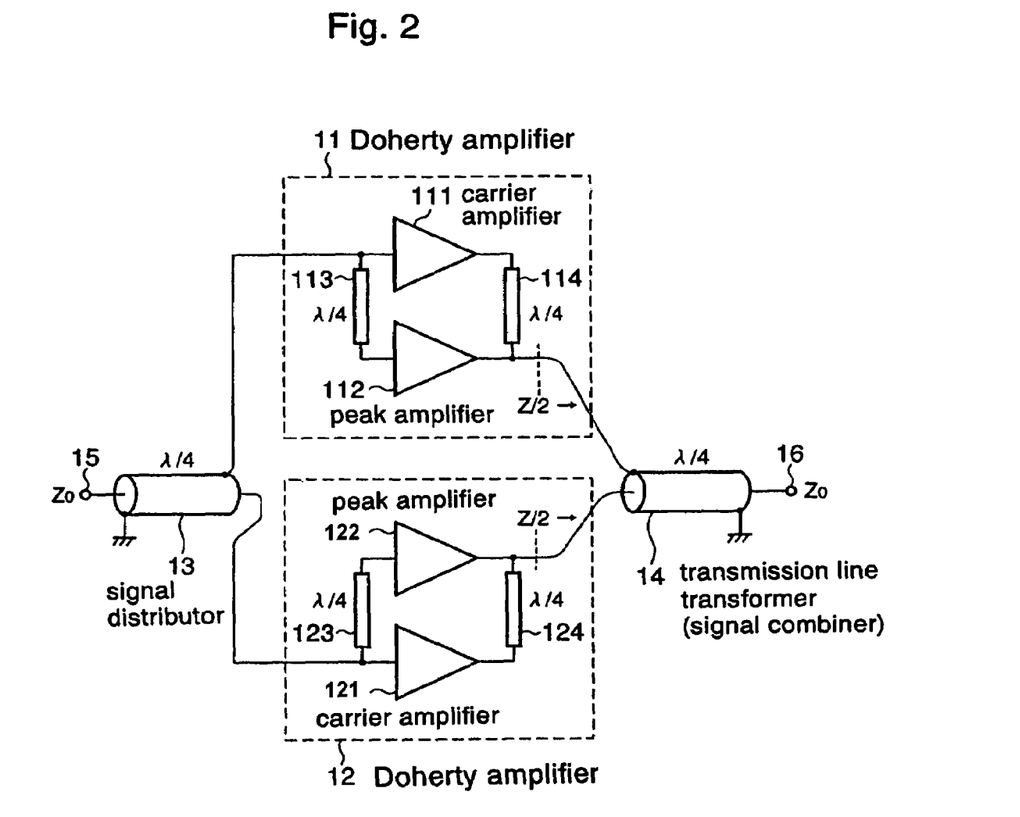
FIG. 2 is a diagram illustrating the configuration of a Doherty amplifier parallel operation circuit according to one embodiment of the present invention.

FIG. 2 is a diagram illustrating the configuration of a Doherty amplifier parallel operation circuit according to one embodiment of the present invention.

As shown in FIG. 2, the Doherty amplifier parallel operation circuit of this embodiment comprises two Doherty amplifiers 11, 12, signal distributor 13, and transmission line transformer 14. Signal distributor 13 distributes an input signal from input terminal 15 to two Doherty amplifiers 11, 12. Doherty amplifier 11 includes carrier amplifier 111, peak amplifier 112, branch circuit 113, and combiner circuit 114. Similarly, Doherty amplifier 12 comprises carrier amplifier 121, peak amplifier 122, branch circuit 123, and combiner circuit 124. By way of example, branch circuits 113, 123 and combiner circuits 114, 124 are each constituted by a one-quarter wavelength transmission line.

Outputs of two Doherty amplifiers 11, 12 are combined by transmission line transformer 14, and delivered from output terminal 16 to a transmission line (not shown) connected thereto. Signal distributor 13 on the input side is of a conventional general type.

The transmission line transformer may be constituted by a one-quarter wavelength coaxial line, by way of example. As another example, the transmission line transformer may be constituted by an equivalent lumped-constant circuit or a parallel two-wire line. Transmission line transformer 14 in the present embodiment is a coaxial cable having a characteristic impedance $Z_0$ and a length of one-quarter wavelength, where $Z_0$ is the characteristic impedance of the transmission line.

Figure 3A:
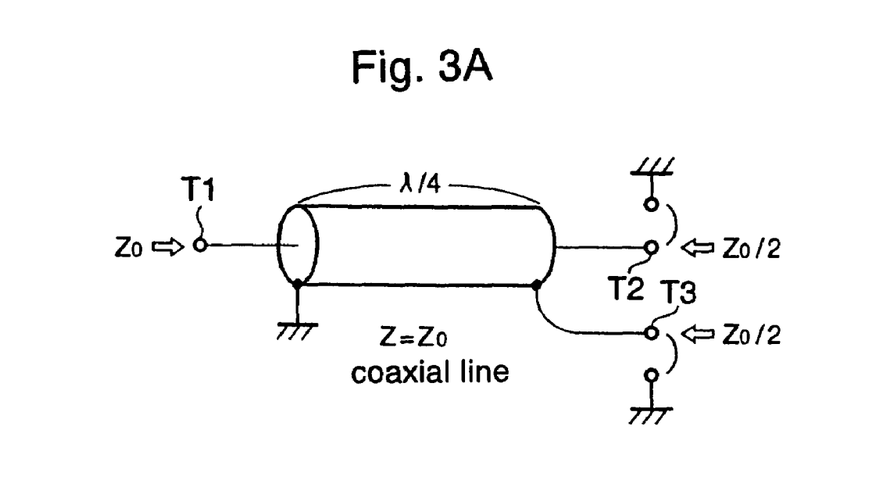
FIGS. 3A to 3C are diagrams for describing a transmission line transformer.
Figure 3B:
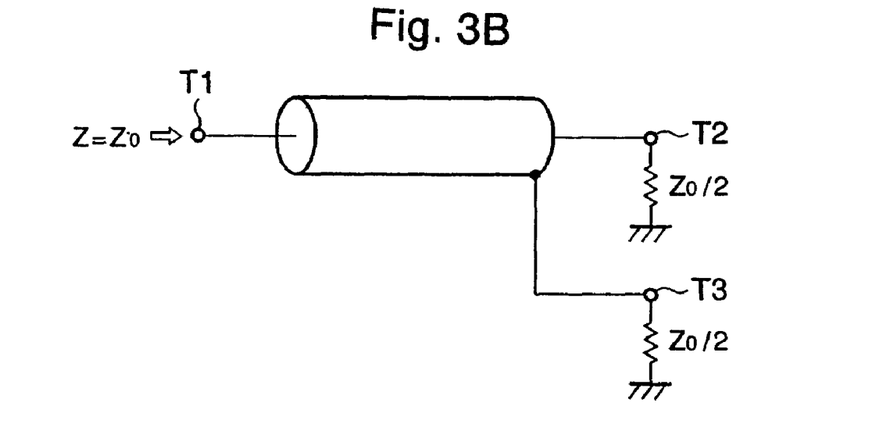
Figure 3C:
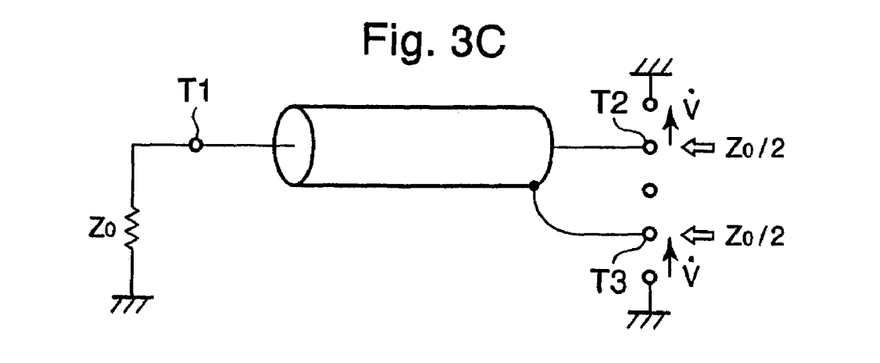

FIGS. 3A to 3C are diagrams for describing the transmission line transformer. As illustrated in FIG. 3A, the transmission line transformer has impedance $Z_0$, as viewed from terminal T1, and impedance $Z_0/2$, as viewed from terminals T2, T3. Specifically, as illustrated in FIG. 3B, assuming that the impedances of terminals T2, T3 are each $Z_0/2$, the impedance of terminal T1 is $Z_0$. As illustrated in FIG. 3C, assuming that the impedance of terminal T1 is $Z_0$, the impedance of terminals T2, T3 are each $Z_0/2$. An opposite-phase condition of a signal for $Z_0/2$ of impedance can be readily established by distributing signals in opposite phase at signal distributor 13 on the input side of Doherty amplifiers 11, 12.

Therefore, when transmission line transformer 14 is used for a signal combiner to combine the outputs of Doherty amplifiers 11, 12 that operate in parallel, as illustrated in FIG. 2, the impedance is $Z_0/2$ when the load is viewed from each Doherty amplifier 11, 12. This is an ideal or optimal load condition for the Doherty amplifier. On the other hand, the impedance is $Z_0$ when the circuit of FIG. 2 is viewed from the output side of transmission line transformer 14, thus establishing the matching to the impedance of the system.

As described above, in the present embodiment, a short transmission line length from each Doherty amplifier 11, 12 to the output reduces transmission loss and accordingly improves amplification efficiency. For example, the construction of this embodiment can reduce transmission loss to approximately one half as much as that which has been produced by a conventional circuit illustrated in FIG. 1, which has an impedance converter that is separate from a hybrid combiner.

Also, since the circuit of this embodiment eliminates a circuit portion which would cause a limited band on the output side, the band can be extended as compared with before. For example, a portion composed of two circuits, i.e., the impedance converter and hybrid combiner in the conventional circuit illustrated in FIG. 1 is replaced with single transmission line transformer 14 in this embodiment. This result in reduction to one-half of the circuit which may causes a limited band.

Also, since the circuit of this embodiment is simple in configuration with only transmission line transformer 14 arranged on the output side of Doherty amplifiers 11, 12, the circuit may be simplified and reduced in size.

Also, because the circuit of this embodiment eliminates a terminator which has been required by a conventional circuit, the cost and size of the circuit is reduced.

Moreover, in the foregoing embodiment, transmission line transformer 14 has a characteristic impedance that is identical to the characteristic impedance of the system, so that transmission line transformer 14 can be constituted by an inexpensive coaxial cable, thus reducing the cost of the circuit.

In summary, according to the foregoing embodiment, input is distributed into two opposite-phase components by signal distributor 13, and the two components are applied to Doherty amplifiers 11, 12, respectively. The outputs of Doherty amplifiers 11, 12 are combined by transmission line transformer 14 which has an impedance of $Z_0/2$ as viewed from Doherty amplifiers 11, 12 and an impedance $Z_0$ as viewed from the output side. Consequently, the resulting Doherty amplifier parallel operation circuit can reduce transmission loss and band limitation, and combine the outputs of the Doherty amplifiers, while satisfying an ideal operation condition of the Doherty amplifiers, in a small, inexpensive, and simple configuration.

Next, a description will be given of another embodiment of the present invention which shows a circuit for operating four Doherty amplifiers in parallel.

Figure 4:
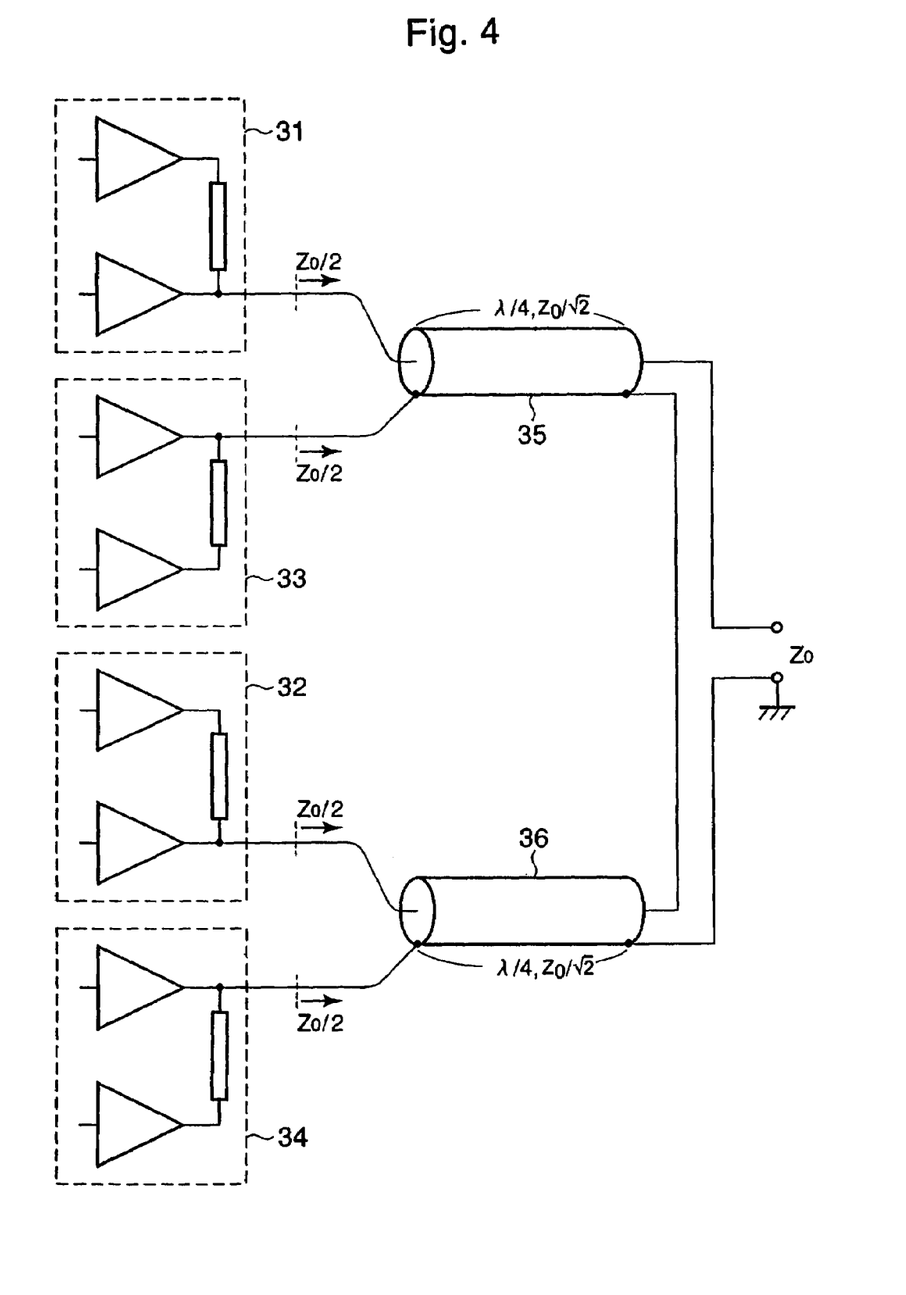
FIG. 4 is a diagram illustrating the configuration of a Doherty amplifier parallel operation circuit according to another embodiment of the present invention.

FIG. 4 is a block circuit diagram illustrating the configuration of the Doherty amplifier parallel operation circuit according to another embodiment of the present invention. Referring to FIG. 4, the Doherty amplifier parallel operation circuit of this embodiment comprises four Doherty amplifiers 31-34, and transmission line transformers 35, 36. Four Doherty amplifiers 31-34 are operated in parallel, while transmission line transformers 35, 36 function as a signal combiner. Assume that the characteristic impedance of transmission line transformers 35, 36 is chosen to be $Z_0/\sqrt{2}$. In FIG. 4 a signal distributor is omitted and is therefore not shown.

The output of Doherty amplifier 31 is connected to a central conductor of transmission line transformer 35, while the output of Doherty amplifier 33 is connected to an external conductor of transmission line transformer 35. Similarly, the output of Doherty amplifier 32 is connected to a central conductor of transmission line transformer 36, while the output of Doherty amplifier 34 is connected to an external conductor of transmission line transformer 36.

Doherty amplifiers 31, 32 are driven in phase, while Doherty amplifiers 33, 34 are also driven in phase. In addition, Doherty amplifiers 31 32 are driven in opposite phase to Doherty amplifiers 33, 34.

On the output side, the central conductor of transmission line transformer 36 is connected to the external conductor of transmission line transformer 35. The central conductor of transmission line transformer 35 and the external conductor of transmission line transformer 36 constitute the output of the Doherty amplifier parallel operation circuit.

Since the Doherty amplifier parallel operation circuit is configured such that Doherty amplifier 33 is driven at opposite phase to Doherty amplifier 31, the impedance is one-half of the impedance $Z_0$ of the transmission line when the load is viewed from Doherty amplifier 31. Similarly, the impedance is also one-half of the impedance $Z_0$ of the transmission line when the load is viewed from each of the remaining Doherty amplifiers 32-34.

Also, when transmission line transformers 35, 36 are connected in a manner shown in this embodiment, the impedance is $Z_0$ when transmission line transformer 35 is viewed from the input side of transmission line transformer 35. Similarly, the impedance is $Z_0$ when transmission line transformer 36 is viewed from the input side of transmission line transformer 36.

As described above, the impedance present when the load is viewed from Doherty amplifiers 31-34, is $Z_0/2$, which represents an ideal load condition of the Doherty amplifiers. On the other hand, since the impedances are each $Z_0/2$, when transmission line transformers 35, 36 are viewed from the output, the impedance is $Z_0$ when the Doherty amplifier parallel operation circuit is viewed from the output side, thus accomplishing the matching to the impedance of the system.

Thus, according to the foregoing embodiment, the outputs of Doherty amplifiers 31-34 are combined by the signal combiner composed of transmission lines 35, 36, the impedance of which is $Z_0/2$ when viewed from the Doherty amplifiers 31-34, and is $Z_0$ when viewed from the output side, the resulting Doherty amplifier parallel operation circuit can reduce transmission loss and band limitation, and combine the outputs of the Doherty amplifiers, while satisfying an ideal operation condition of the Doherty amplifiers in a small, inexpensive, and simple configuration.

While the foregoing embodiment has shown an example in which the transmission line transformers are each composed of a coaxial wire, the transmission line transformers may each be composed of an equivalent lumped-constant circuit or a parallel two-wire line.

Next, a description will be given of a further embodiment of the present invention which shows a circuit for operating $k^2$ (k is a positive even number) Doherty amplifiers in parallel.

Figure 5:
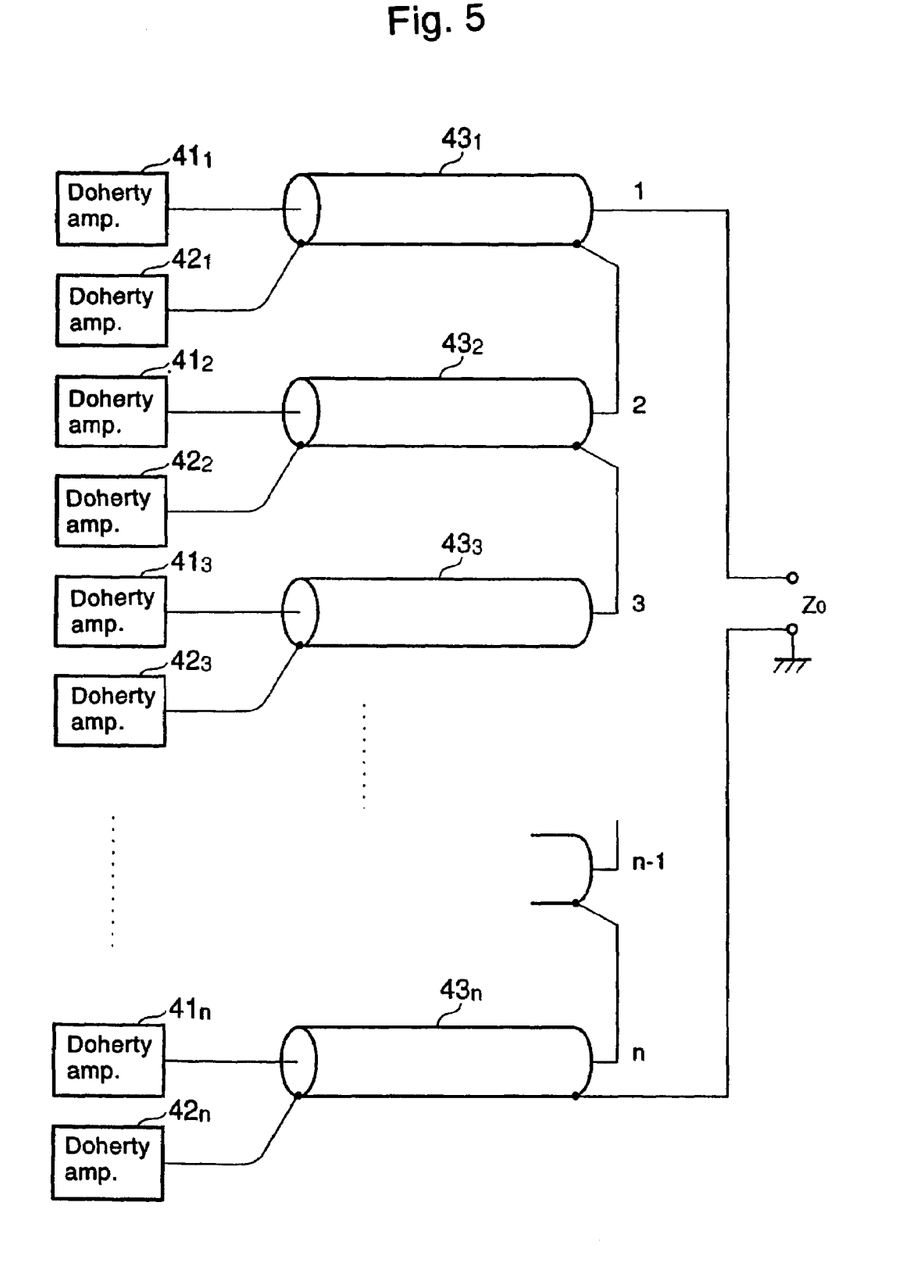
FIG. 5 is a diagram illustrating the configuration of a Doherty amplifier parallel operation circuit according to yet another embodiment of the present invention.

FIG. 5 is a block circuit diagram illustrating the configuration of the Doherty amplifier parallel operation circuit according to a further embodiment of the present invention. Referring to FIG. 5, the Doherty amplifier parallel operation circuit of this embodiment comprises 2n Doherty amplifiers $41_1$-$41_n$, $42_1$-$42_n$, and n transmission line transformers $43_1$-$43_n$, where $n=k^2/2$. Transmission line transformers $43_1$-$43_n$ make up a signal combiner. Assume that the characteristic impedance of transmission line transformers $43_1$-$43_n$ is chosen to be $Z_0/\sqrt{n}$. In FIG. 5, a signal distributor is omitted, and is not therefore shown.

Each transmission line transformer $43_1$-$43_n$ has a central conductor connected to the output of each Doherty amplifiers $41_1$-$41_n$, and an external conductor connected to the output of each Doherty amplifiers $42_1$-$42_n$.

Doherty amplifiers $41_1$-$41_n$ are all driven in phase, while Doherty amplifiers $42_1$-$42_n$ are also operated in phase. In addition, Doherty amplifiers $41_1$-$41_n$ are all operated in opposite phase to Doherty amplifiers $42_1$-$42_n$.

On the output side, the central conductor of transmission line transformer $43_i$ (i=2–n) is connected to the external conductor of transmission line transformer $43_{(i-1)}$. Also, the central conductor of transmission line transformer $43_1$ and the external conductor of transmission line transformer $43_n$ constitute the output of the Doherty amplifier parallel operation circuit.

Since the Doherty amplifier parallel operation circuit is configured such that Doherty amplifiers $41_1$-$41_n$, $42_1$-$42_n$ are driven in opposite phase to each other, the impedance is one-half of impedance $Z_0$ of the transmission line when the load is viewed from Doherty amplifiers $41_1$-$41_n$. Similarly, the impedance is also one-half of the impedance $Z_0$ of the transmission line when the load is viewed from Doherty amplifiers $42_1$-$42_n$.

Also, when transmission line transformers $43_1$-$43_n$ are connected in a manner shown in this embodiment, the impedance is $Z_0$ when transmission line transformers $43_1$-$43_n$ are viewed from the input side of transmission line transformers $43_1$-$43_n$.

As described above, the impedance when the load is viewed from Doherty amplifiers $43_1$-$43_n$ is $Z_0/2$, which represents an ideal load condition of the Doherty amplifiers. On the other hand, since the impedances are each $Z_0/2$, when transmission line transformers $43_1$-$43_n$ are viewed from the output, the impedance is $Z_0$ when the Doherty amplifier parallel operation circuit is viewed from the output side, thus accomplishing the matching to the impedance of the system.

For the transmission line transformers having characteristic impedance $Z_0/\sqrt{n}$, li 6 nes previously so designed and manufactured are preferably used, by way of example.

Alternatively, instead of the lines which have been previously designed and manufactured to have characteristic impedance $Z_0/\sqrt{n}$, transmission line transformers, the characteristic impedance of which is $Z_0$, may be connected in parallel to make up a transmission line transformer which may be used for the transmission line transformer that has characteristic impedance $Z_0/\sqrt{n}$.

Now consider, by way of example, that four Doherty amplifiers are operated in parallel with $Z_0$ being 50 ohms. In this event, since n=2, the characteristic impedance of the transmission lines may be chosen to be 35.35 ohms, as calculated by $50/\sqrt{2}$. Instead of employing so-called dedicated coaxial wires having such a characteristic impedance, two 75-ohm coaxial wires, which are general and inexpensive standard items, may be connected in parallel to make up a transmission line transformer, the characteristic impedance of which is 35 ohms (=75/2).

While each of the foregoing embodiments has been described for Doherty amplifiers, whose load impedance is $Z_0/2$, the present invention is not limited to such Doherty amplifiers. The technical idea underlying the Doherty amplifier parallel operation circuit of the present invention can be applied as well to any Doherty amplifier which is designed for ideal operation under other load conditions.

Also, in each of the foregoing embodiments so far described, two Doherty amplifiers, which form a pair and are connected to the same transmission line transformer, are driven in opposite phase to each other. The present invention, however, is not limited to this particular configuration. Rather than necessarily driven in opposite phase, two Doherty amplifiers can be operated in parallel by adjusting a phase relationship between them and the design of transmission line transformers connected to the outputs of these Doherty amplifiers (the wire length, impedance and the like when formed of a coaxial wire).

While preferred embodiments of the present invention have been described using specific terms, such description is for illustrative purposes only, and it is to be understood that changes and variations may be made without departing from the spirit or scope of the following claims.

What is claimed is:

1. A Doherty amplifier parallel operation circuit for amplifying an input signal to deliver the amplified signal to its output terminal, said circuit comprising:
   a plurality of Doherty amplifiers each receiving the input signal distributed thereto to amplify the input signal and deliver the amplified signal; and
   a signal combiner comprised of a transmission line transformer and connected to the outputs of said Doherty amplifiers and to the output terminal for combining the outputs of said Doherty amplifiers to deliver the combined output from the output terminal, said signal combiner presenting an impedance which represents an optimal load for said Doherty amplifiers, when viewed from said Doherty amplifiers, and an impedance viewed from the output terminal which matches the characteristic impedance of a transmission line connected to the output terminal.

2. The Doherty amplifier parallel operation circuit according to claim 1, wherein:
   the number of said Doherty amplifiers is two, and the number of said transmission line transformer is one, said transmission line transformer having a characteristic impedance matches to that of said transmission line; and
   said two Doherty amplifiers have outputs connected to two terminals, respectively, on the input side of said transmission line transformer.

3. The Doherty amplifier parallel operation circuit according to claim 2, wherein said two Doherty amplifiers are driven in opposite phase to each other.

4. The Doherty amplifier parallel operation circuit according to claim 1, wherein:
   the number of said Doherty amplifiers is $k^2$, where k is a positive even number, n of said transmission line transformers, where n is equal to $k^2/2$, and each said transmission line transformer has a characteristic impedance $1/\sqrt{n}$ as large as that of said transmission line;
   each two of said Doherty amplifiers forms a pair, with their outputs connected to two terminals on the input side of one of said transmission line transforms, respectively; and
   all said transmission line transformers have their output terminals connected in series.

5. The Doherty amplifier parallel operation circuit according to claim 4, wherein said Doherty amplifiers forming a pair are driven in opposite phase to each other, and one of said Doherty amplifiers in each pair is driven in phase with one of said Doherty amplifiers in all the pairs.

6. The Doherty amplifier parallel operation circuit according to claim 1, wherein said transmission line transformer comprises a coaxial wire having a length equal to one-quarter wavelength of the input signal.

7. The Doherty amplifier parallel operation circuit according to claim 1, wherein an optimal load for said Doherty amplifiers is one-half of the characteristic impedance of said transmission line.

8. The Doherty amplifier parallel operation circuit according to claim 4, wherein the number of said transmission line transformers is two, said transmission line has a characteristic impedance of 50 ohms, and each of said transmission line transformers is composed of two coaxial wires connected in parallel, said coaxial wires each having a characteristic impedance of 75 ohms.

* * * * *